United States Patent [19]

Chesley

[11] 4,333,142
[45] * Jun. 1, 1982

[54] SELF-CONFIGURABLE COMPUTER AND MEMORY SYSTEM

[76] Inventor: Gilman D. Chesley, 22431 Starling Dr., Los Altos, Calif. 94022

[ * ] Notice: The portion of the term of this patent subsequent to Mar. 4, 1997, has been disclaimed.

[21] Appl. No.: 56,909

[22] Filed: Jul. 12, 1979

Related U.S. Application Data

[62] Division of Ser. No. 818,235, Jul. 22, 1977.

[51] Int. Cl.³ .............................................. G06F 11/04
[52] U.S. Cl. .............................. 364/200; 324/73 AT; 324/73 PC
[58] Field of Search ... 364/200 MS File, 900 MS File; 371/21, 25, 29; 365/201; 324/73 R, 73 PC, 73 AT

[56] References Cited

U.S. PATENT DOCUMENTS

| | | | |
|---|---|---|---|
| 3,659,088 | 4/1972 | Boisvert | 371/29 X |
| 3,704,363 | 11/1972 | Salmassy et al. | 364/200 |
| 3,758,761 | 9/1973 | Henrion | 364/200 X |
| 3,838,260 | 9/1974 | Nelson | 371/16 |
| 3,913,072 | 10/1975 | Catt | 364/900 |
| 3,917,933 | 11/1975 | Scheuneman et al. | 364/200 |
| 3,999,051 | 12/1976 | Petschaver | 371/29 X |
| 4,038,648 | 7/1977 | Chesley | 324/78 R |
| 4,058,851 | 11/1977 | Schevneman | 364/200 |
| 4,066,880 | 1/1978 | Salley | 371/21 X |

Primary Examiner—Gareth D. Shaw
Assistant Examiner—John G. Mills, III
Attorney, Agent, or Firm—Flehr, Hohbach, Test, Albritton & Herbert

[57] ABSTRACT

Computer and memory system on a wafer which contains redundant elements and which is capable of self-testing and self-configuration to form a complete system consisting of a central processing unit (CPU), a read only memory unit (ROM), and a plurality of read/write random access memory units (RAM). These units are interconnected by a common bus, which is also available for external connections to the wafer. The first CPU tests each ROM to find a good one and then uses the program contained in that ROM to test itself. If the first CPU does not test satisfactorily, the remaining CPU's are tested until a good one is found. The RAM's are then tested with the good ROM and CPU, and the results are tabulated to form a page oriented computer system.

6 Claims, 4 Drawing Figures

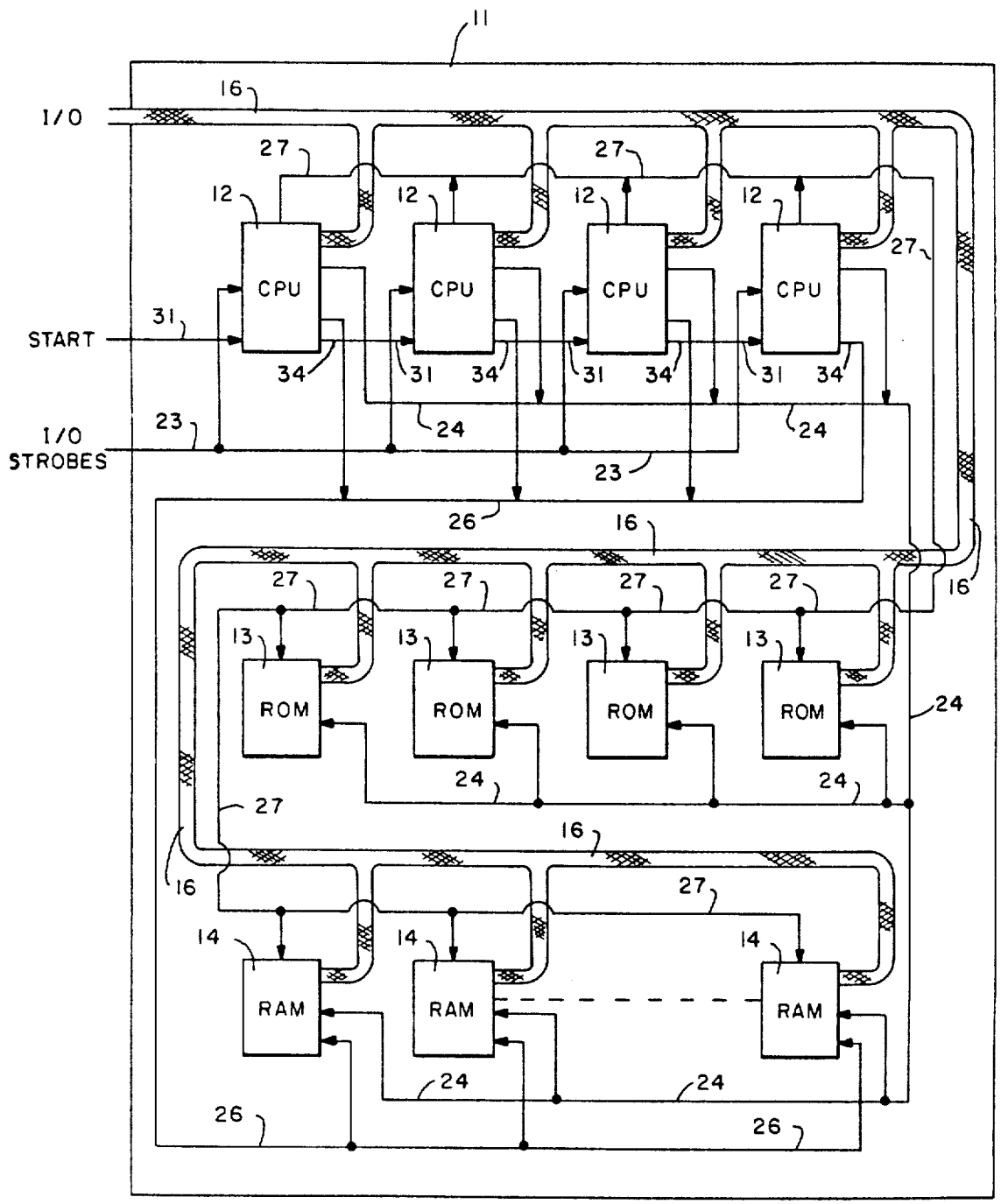
FIG.—1

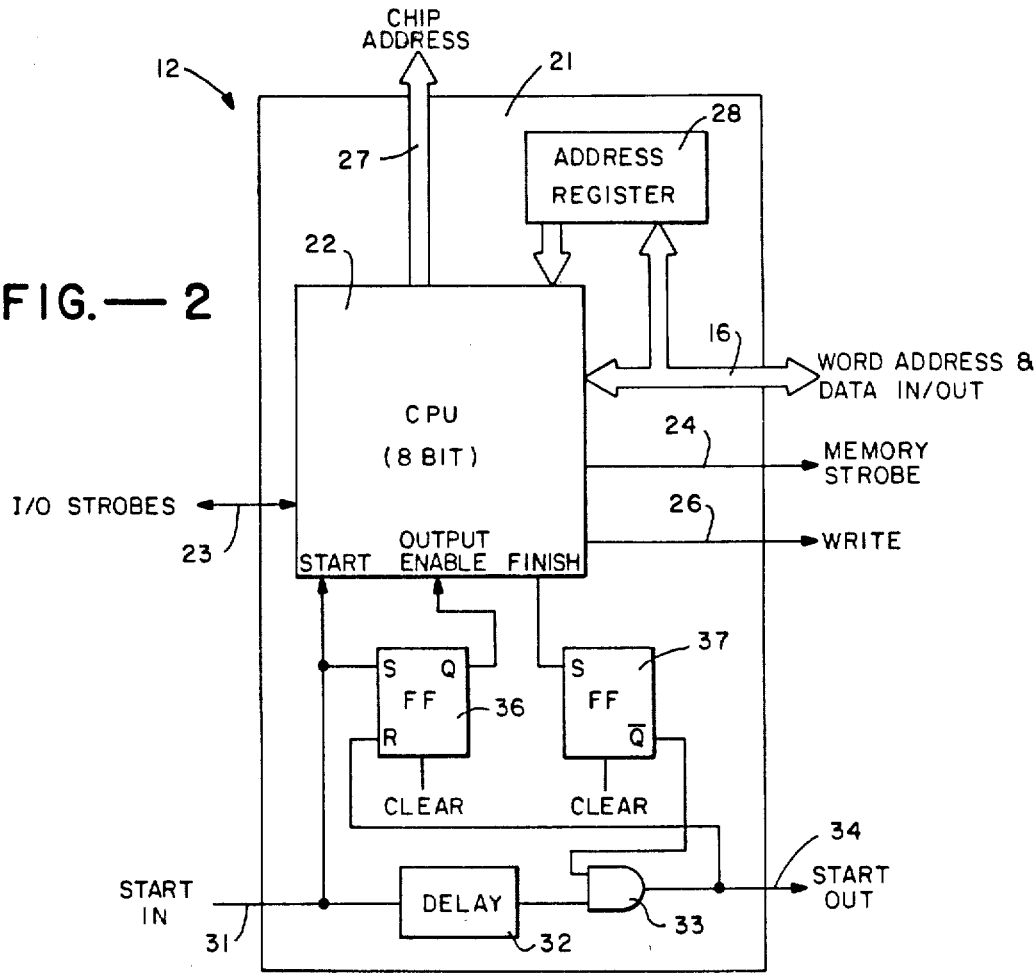
FIG.—2
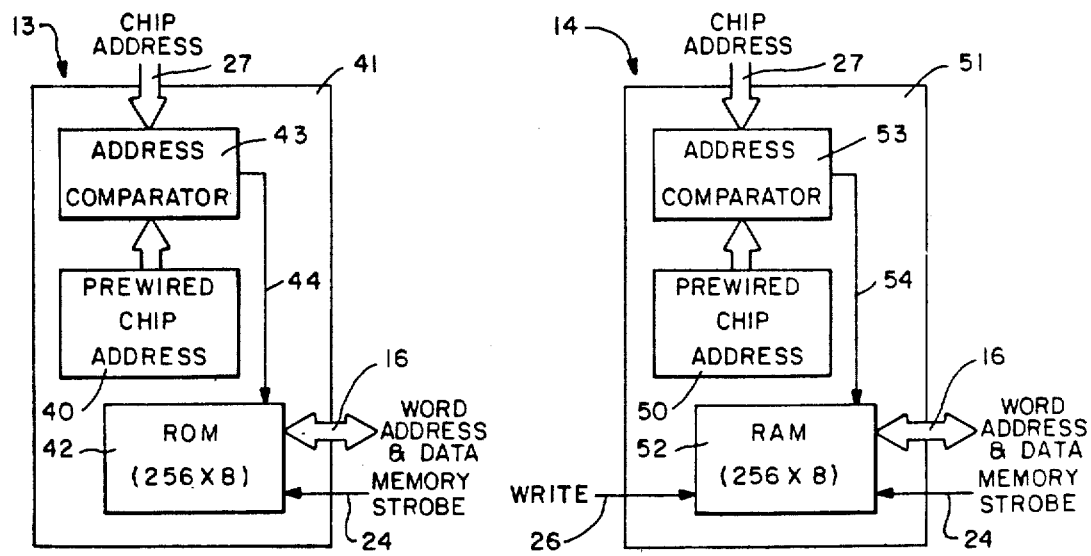
FIG.—3    FIG.—4

SELF-CONFIGURABLE COMPUTER AND MEMORY SYSTEM

This is a division, of application Ser. No. 818,235 filed July 22, 1977.

BACKGROUND OF THE INVENTION

This invention pertains generally to computer and memory systems and more particularly to a self-configurable computer and memory system formed on a single wafer.

Computer systems are commonly created by interconnecting smaller modules such as CPU's, memory modules, and input/output controllers. These modules are often interconnected by a common bus which carries the full word data and memory address data in parallel.

In recent years, large scale integration (LSI) has been developed to the point where the modules can be integrated on a single chip, e.g., microprocessor CPU's. Thus, using LSI modules and a common bus for interconnection, a complete computer system can be constructed on a wafer. However, a potential problem exists because a bad LSI module can cause the entire wafer computer system to malfunction. Thus, redundant modules must be present on the wafer, and means for testing and avoiding bad modules must be provided.

Prior art techniques such as discretionary wiring, pad relocation, probe testing and computer mask generation might be used. However, these techniques have the disadvantage of high cost and inflexibility when other circuits fail in use.

SUMMARY AND OBJECTS OF THE INVENTION

The invention provides a self-configurable computer and memory system in which a plurality of CPU, ROM, and RAM modules are formed on a semiconductor wafer. A first one of the CPU's is used for testing the ROM's until a good ROM is found. The CPU's are then tested with a program from the good ROM until a good CPU is found, and then the RAM's are tested with the good CPU and ROM. Data indicating the condition of the RAM's is stored in a table formed in the CPU registers or in one of the RAM's or in another suitable store. Memory space is allocated on a page basis, with each memory chip constituting one page.

It is in general an object of the invention to provide a new and improved computer and memory system and method of configuring the same.

Another object of the invention is to provide a system and method of the above character in which the computer and memory system is self-configurable.

Additional objects and features of the invention will be apparent from the following description in which the preferred embodiments are set forth in detail in conjunction with the accompanying drawings.

BRIEF DESCRIPTION OF THE DRAWINGS

FIG. 1 is a block diagram of one embodiment of a computer and memory system according to the invention.

FIG. 2 is a block diagram of one of the CPU modules of the computer and memory system of FIG. 1.

FIG. 3 is a block diagram of one of the ROM modules of the computer and memory system of FIG. 1.

FIG. 4 is a block diagram of one of the RAM modules of the computer and memory system of FIG. 1.

DESCRIPTION OF THE PREFERRED EMBODIMENTS

As illustrated in FIG. 1, the computer and memory system is constructed in integrated form on a semiconductor wafer 11. The system includes a plurality of CPU modules 12, ROM modules 13 and RAM modules 14. In the embodiment illustrated, four CPU modules and four ROM modules are provided, although a greater or lesser degree of redundancy can be provided if desired. In this embodiment, 252 RAM modules are provided. The CPU, ROM and RAM modules are all interconnected by a common bus 16 which is also accessible externally of the wafer.

Referring now to FIG. 2, each of the CPU modules is formed on a separate chip 21 and includes a central processing unit 22 which, in the preferred embodiment, comprises a standard 8-bit microprocessor with a standard instruction set. The CPU has I/O STROBE lines 23, a MEMORY STROBE output 24, and a WRITE output 26. Word address and input and output data pass to and from the CPU on common bus 16, and chip address signals are provided on CHIP ADDRESS lines 27. The CPU module also includes an address register 28 which can be used either for storing the address of the first good RAM module or for storing a table of the good RAM's.

Each CPU module also includes a START IN line 31 which is connected to the input of a delay circuit 32. The output of the delay circuit is connected to one input of an AND gate 33, and the output of this gate is connected to a START OUT line 34. As illustrated in FIG. 1, the START OUT line of each CPU module is connected to the START IN line of the next successive CPU module.

Within each of the CPU modules, START IN line 31 is also connected to the SET input of a flip flop 36 and to the CPU itself. The RESET input of flip flop 36 is connected to the output and gate 33, and the output of flip flop 36 is connected to the OUTPUT ENABLE input of the CPU. AND gate 33 receives a second input from a START INHIBIT flip flop 37, which received a SET input from the CPU only if the CPU tests satisfactorily.

In operation, flip flops 36, 37 are both in the cleared state initially, the START signal is applied simultaneously to delay circuit 32, to the SET input of flip flop 36, and to the CPU. With flip flop 36 in its SET condition, the output lines of the CPU are enabled. If the CPU tests satisfactorily, a SET signal is delivered to flip flop 37 upon completion of the testing. With flip flop 37 set, the START signal which emerges from delay circuit 32 cannot pass through AND gate 33, and flip flop 36 remains in its SET condition. If the CPU has not tested satisfactorily by the time the START signal emerges from the delay circuit, this signal passes through gate 33 to the next CPU module. The START signal on output line 34 resets flip flop 36, thereby disabling the output lines of that CPU.

As illustrated in FIG. 3, each of the ROM modules 13 is formed on a separate chip 41 and includes a read only memory 42 of conventional design. In the embodiment illustrated, the ROM is organized in 256 words of 8-bits each, and it utilizes common bus 16 for both word address and for data in and data out. Each ROM module has a unique prewired chip address 40 and an address comparator 43 which compares this address with the chip addresses generated by the CPU on lines 27. When the address from the CPU matches the prewired address of the chip, an ENABLE signal is applied to the ROM by the address comparator via line 44. Each ROM receives MEMORY STROBE signals on line 24.

Each ROM module contains an identical copy of a CPU and RAM test program as well as other desired service routines, with the addresses shifted to reflect the proper module addresses. In addition, the last word of each ROM module contains a check sum of all of the other words of the module so that a CPU can perform a simple test function, in this case summation, upon all words of the ROM to verify that the ROM is operating correctly. This check sum routine is permanently built into the logic of each CPU.

As illustrated in FIG. 4, RAM modules 14 are generally similar to ROM modules 13, except that they include a read/write memory. Each of the RAM modules is formed on a separate chip 51 and includes a standard random access memory 52 organized in 256 words of 8-bits each. Each RAM module has a unique prewired address 50 and an address comparator 53 which compares this address with the chip addresses from the CPU. The output of the comparator is connected to the ENABLE input of the RAM by a line 54. The WRITE signals from the CPU are applied to the RAM via line 26.

Operation and use of the computer and memory system, and therein the method of the invention are as follows. Whenever power is applied to the wafer, a START signal is applied to the first CPU. Upon receipt of the START signal, the CPU accesses the words of the first ROM then adds them together and compares the result with the final word containing the check sum. If this test fails, it is performed upon the next ROM in turn. When a good ROM is found, the CPU test routine contained within the ROM is executed by the CPU to determine if the CPU is good. If both the ROM and the CPU test satisfactorily, the START INHIBIT flip flop is turned on or set, thereby preventing the passage of the START signal to the next CPU. If the first CPU does not test satisfactorily or cannot find a good ROM, the START signal passes to the next CPU. The process continues until a good ROM and a good CPU are found. If neither can be found, the wafer is discarded.

Once a good ROM and a good CPU are found, the CPU uses a RAM test routine contained in the ROM to test each RAM module in sequence. The address of the first good RAM module is stored in register 28, and a table of the addresses of the good and bad RAM's is created in the first good RAM. Alternatively, the table of good and bad RAM address can be maintained in register 28.

The RAM's are utilized as a page allocated memory system in which data and program space is allocated on demand on a page basis, with each RAM module corresponding to one page. Space is de-allocated on the same basis when it is no longed needed. In this embodiment, a page contains 256 8-bit words. Bad RAM modules are simply treated as permanently allocated and unavailable as pages.

It is apparent from the foregoing that a new and improved computer system and method of configuring the same have been provided. While only the presently preferred embodiments have been described in detail, as will be apparent to those familiar with the art, certain changes and modifications can be made without departing from the scope of the invention as defined by the following claims.

For example, as technology permits, larger word widths and different degrees of module redundancy may be used. Furthermore, other modules such as I/O controllers may be included on the wafer using the described test and configure technique. Also, the separate ROM modules may be eliminated by embedding them in the CPU's in the form of ROM's, PLA's, or wired-in test sequences. In this case, separate ROM testing could be eliminated. If the CPU and ROM are located off the wafer, there is no need for redundancy of these units.

What is claimed is:

1. In a self-configurable integrated circuit structure: a semiconductor wafer, a plurality of memory chips formed on the wafer, each of said memory chips having a predetermined unique address, an address table representing the addresses of all of the memory chips, a common bus for carrying signals to the memory chips during normal operation of the same, means for applying test signals to the memory chips via the common bus and means for sensing the manner in which the memory chips respond to the test signals and storing data in the address table to indicate the condition of each memory chip for subsequent automatic assignment of memory space.

2. The integrated circuit structure of claim 1 wherein the address table is located in one of the memory chips.

3. The integrated circuit structure of claim 1 further including a CPU connected to the memory chips via the common bus and programmed to apply the test signals to the chips.

4. In a method of configuring an integrated circuit structure, the steps of: forming a plurality of memory chips on a semiconductor wafer with a common bus interconnecting all of said chips, each of said memory chips having a predetermined unique address, applying test signals to the memory chips via the common bus, sensing the responses of the memory chips to the test signals, and creating an address table representing the addresses of all of the memory chips and containing data indicating which of the memory chips respond to the test signals in a predetermined manner for subsequent automatic assignment of memory space.

5. The method of claim 4 wherein the address table is created in one of the memory chips.

6. The method of claim 4 wherein storage space is allocated on a page basis, with each memory chip corresponding to one page.

* * * * *